United States Patent
Jacques et al.

(10) Patent No.: US 7,910,477 B2
(45) Date of Patent: Mar. 22, 2011

(54) ETCH RESIDUE REDUCTION BY ASH METHODOLOGY

(75) Inventors: Jeannette Michelle Jacques, Rowlett, TX (US); Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 11/965,972

(22) Filed: Dec. 28, 2007

(65) Prior Publication Data

US 2009/0170221 A1 Jul. 2, 2009

(51) Int. Cl.
*H01L 21/4763* (2006.01)

(52) U.S. Cl. ........ 438/636; 438/637; 438/638; 438/639; 438/642; 438/643; 438/645; 438/710; 438/734; 257/E21.579; 257/E21.029; 257/E21.257

(58) Field of Classification Search .................... 438/636
See application file for complete search history.

(56) References Cited

U.S. PATENT DOCUMENTS

| | | | |
|---|---|---|---|
| 6,323,121 B1 * | 11/2001 | Liu et al. | 438/633 |
| 6,362,093 B1 * | 3/2002 | Jang et al. | 438/633 |
| 6,399,483 B1 * | 6/2002 | Liu et al. | 438/638 |
| 6,582,974 B2 * | 6/2003 | Lui et al. | 438/6 |
| 6,727,185 B1 | 4/2004 | Smith et al. | |
| 7,015,149 B2 * | 3/2006 | Woo | 438/738 |
| 7,033,944 B2 * | 4/2006 | Park et al. | 438/696 |
| 7,094,688 B2 * | 8/2006 | Oryoji | 438/638 |
| 7,169,440 B2 | 1/2007 | Balasubramaniam et al. | |
| 7,192,877 B2 | 3/2007 | Ali | |
| 7,192,878 B2 | 3/2007 | Weng et al. | |
| 7,344,992 B2 * | 3/2008 | Choi | 438/706 |
| 2003/0170993 A1 * | 9/2003 | Nagahara et al. | 438/694 |
| 2003/0192856 A1 * | 10/2003 | Balasubramaniam et al. | 216/56 |
| 2003/0224595 A1 | 12/2003 | Smith et al. | |
| 2004/0063306 A1 * | 4/2004 | Takeuchi | 438/622 |
| 2004/0127016 A1 | 7/2004 | Hoog et al. | |
| 2005/0045206 A1 | 3/2005 | Smith et al. | |
| 2005/0079405 A1 * | 4/2005 | Enomoto et al. | 429/54 |
| 2005/0079717 A1 | 4/2005 | Savas et al. | |
| 2005/0101125 A1 | 5/2005 | Smith et al. | |
| 2005/0142855 A1 * | 6/2005 | Choi | 438/637 |
| 2006/0000804 A1 * | 1/2006 | Oyama et al. | 216/67 |
| 2006/0094221 A1 * | 5/2006 | Soda et al. | 438/597 |
| 2007/0184666 A1 | 8/2007 | Smith et al. | |
| 2007/0224825 A1 * | 9/2007 | Xiao et al. | 438/700 |

OTHER PUBLICATIONS

"Metal Hardmask Etch Residue Removal for Advanced Copper / Low-k Devices", Hua Cui, Simon J. Kirk and David Maloney, 2007 IEEE/SEMI Advanced Semiconductor Manufacturing Conference, pp. 366-370.

* cited by examiner

*Primary Examiner* — Charles D Garber
*Assistant Examiner* — Pape Sene
(74) *Attorney, Agent, or Firm* — Warren L. Franz; Wade J. Brady, III; Frederick J. Telecky, Jr.

(57) ABSTRACT

Methods for forming dual damascene interconnect structures are provided. The methods incorporate an ashing operation comprising a first ash operation and a second overash operation. The ashing operation is performed prior to etching of an etch stop layer. The operation removes residue from a cavity formed during formation of the interconnect structure and facilitates better CD control without altering the cavity profiles.

13 Claims, 8 Drawing Sheets

ETCH RESIDUE REDUCTION BY ASH METHODOLOGY

FIELD OF THE INVENTION

The invention relates to semiconductor devices and, more particularly, to a method of reducing etch residue in a dual damascene structure.

BACKGROUND OF THE INVENTION

In the manufacture of semiconductor products such as integrated circuits, individual electrical devices are formed on or in a semiconductor substrate, and are thereafter interconnected to form electrical circuits. Interconnection of these devices within an integrated circuit is typically accomplished by forming a multi-level interconnect network in layers formed over the electrical devices, by which the device active elements are connected to one another to create the desired circuits. Individual wiring layers within the multi-level network are formed by depositing an insulating or dielectric layer over the discrete devices or over a previous interconnect layer, and patterning and etching cavities such as vias and trenches. Conductive material, such as copper is then deposited into the cavities and the wafer is planarized using chemical mechanical polishing (CMP) to form an interconnect structure.

Typical interconnect structures are fabricated using single or dual damascene processes in which trenches and vias are formed (etched) in dielectric layer. Copper is then deposited into the trenches and vias and over the insulative layer, followed by CMP planarization to leave a copper wiring pattern including the desired interconnect metal inlaid within the dielectric layer trenches. The process may be repeated to form further interconnect layers or levels by which the desired circuit interconnections are made in a multi-level interconnect network.

Etch-stop layers are often formed beneath the dielectric material layers to provide controlled stopping of the via and/or trench formation etch processes. Silicon nitride (SiN) is typically employed as an etch stop material, although recently silicon carbide (SiC) has also been used for etch stop layers in interconnect processing. Diffusion barriers are often formed in the damascene cavities prior to deposition of copper to mitigate diffusion of copper into the dielectric material. Such barriers are typically formed using conductive compounds of transition metals such as tantalum nitride, titanium nitride and tungsten nitride, as well as the various transition metals themselves. Conductive metals, such as aluminum, copper, or the like are then used to fill the cavities after barrier layer formation, where copper is gradually replacing aluminum to improve the conductivity of the interconnect circuits.

To reduce or control RC delay times in finished semiconductor products, recent developments have focused on low dielectric constant (low-k) dielectric materials for use between the metal wiring lines, in order to reduce the capacitance therebetween and consequently to increase circuit speed. Examples of low-k dielectric materials include spin-on-glasses (SOGs), as well as organic and quasi-organic materials such as organo-silicate-glasses (OSGs), for example, having dielectric constants (k) as low as about 2.6-2.8, and ultra low-k dielectrics having dielectric constants below 2.5. OSG materials are low density silicate glasses to which alkyl groups have been added to achieve low-k dielectric characteristic.

Single and dual damascene processes using OSG, FSG, or ultra-low k dielectric materials, SiC material, and copper fill metals can thus be employed to increase speed, reduce cross talk, and reduce power consumption in modern high-speed, high-density devices. However, incorporating these materials into workable semiconductor fabrication processes presents additional challenges. Etch processes used to remove various layers in an etch stack, including SOG layers, underlayers, dielectric layers, the etch-stop material beneath the dielectric layer or layers, and the like, often leave polymer residue on various areas of the wafer surface, including, among others, on the dielectric sidewalls and the bottom of the trench or via cavities, which must be cleaned or removed prior to barrier formation and filling.

This residual polymer, if left uncleaned, causes a high resistance interface between underlying conductive features and the deposited fill or barrier material, thus exacerbating RC delays. However, the cleaning process itself must not corrode or damage the underlying conductive feature to which connection is to be made. Further, the cleaning process should not change the dimensions of the cavities. Wet cleaning processes have been used in the past to remove polymers formed on oxide type dielectric sidewalls when etching through SiN type etch-stop layers. Thus, there remains a need for fabricating single and/or dual damascene interconnect structures in semiconductor wafers by which these and other adverse effects can be mitigated or overcome, without negatively impacting production costs or cycle times.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for fabricating single or dual damascene interconnect structures which may be employed to mitigate the above-mentioned and other adverse effects. The invention may be employed to facilitate better CD control without altering the trench/via profiles.

In accordance with one aspect of the invention, a method is provided for forming a dual damascene interconnect structure overlying an existing interconnet structure in a semiconductor wafer to provide electrical coupling to a conductive feature in an exiting interconnect structure, the method comprising forming an etch stop layer over the existing interconnect structure; forming a dielectric layer over the etch-stop layer; forming a via cavity in the dielectric layer over the etch stop layer; forming a trench cavity in the dielectric layer; performing an ashing operation to remove polymer residue; and extending the via cavity through a portion of the etch stop layer to expose the conductive feature in the existing interconnect structure.

Another aspect of the invention provides a method for the removal of residue from a cavity during formation of a dual damascene interconnect structure overlying an existing interconnet structure in a semiconductor wafer to provide electrical coupling to a conductive feature in an existing interconnect structure, the method comprising forming an etch stop layer over the existing interconnect structure; forming a dielectric layer over the etch-stop layer; forming a via cavity in the dielectric layer over the etch stop layer; forming a trench cavity in the dielectric layer; performing an ashing operation to remove polymer residue; and extending the via cavity through a portion of the etch stop layer to expose the conductive feature in the existing interconnect structure.

A further aspect of the invention provides a method for manufacturing an integrated circuit, comprising providing a semiconductor wafer having a dual damascene interconnect structure overlying an existing interconnet structure thereon, including forming an etch stop layer over the interconnect structure; forming a dielectric layer over the etch-stop layer; forming a via cavity in the dielectric layer over the etch stop layer; forming a trench cavity in the dielectric layer; performing an ashing operation to remove polymer residue; and extending the via cavity through a portion of the etch stop layer to expose the conductive feature in the existing interconnect structure.

BRIEF DESCRIPTION OF THE DRAWING FIGURES

Figure 4A:
Figure 4B:
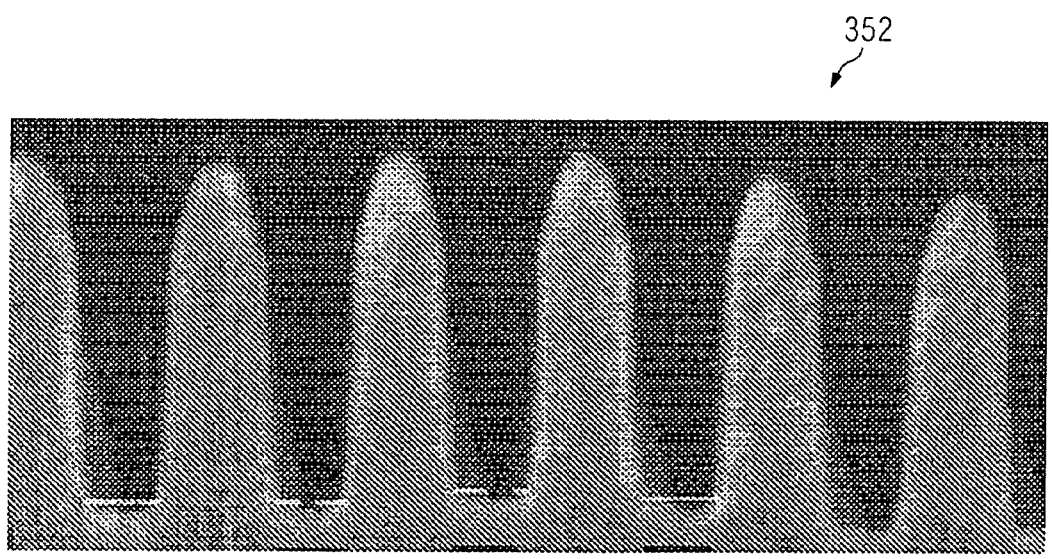

FIGS. 3A-3J partial side elevation views in section illustrating fabrication of an exemplary via-first dual damascene interconnect structure in accordance with the invention;

FIG. 4A is a cross-sectional side elevation view scanning electron microscope (SEM) image of dual damascene trenches formed according to conventional processes following etch-stop etching; and FIG. 4B is a cross-sectional side elevation view SEM image of dual damascene trenches formed following the ashing operation of the invention.

DESCRIPTION OF THE INVENTION

The present invention will now be described with reference to the attached drawings, wherein like reference numerals are used to refer to like elements throughout. The invention relates to methods for forming single and/or dual damascene interconnect structures, including via and/or trench cavities or openings during interconnect processing of integrated circuits and other semiconductor devices. One or more implementations of the invention are hereinafter illustrated and described in the context of single or dual damascene trench and/or via cavity formation in low-k dielectric structures, wherein silicon nitride (SiN) and/or silicon oxide (SiO) etch-stop layers are employed. However, it will be appreciated by those skilled in the art that the invention is not limited to the exemplary implementations illustrated and described hereinafter. In particular, the various aspects of the invention may be employed in association with processing of devices using OSG, FSG, or other low-k or ultra low-k dielectric materials, and other types of etch-stop layer materials. Further, the dual damascene formation methods of the invention may be employed in association with via-first and/or trench-first implementations.

Although only a single via and trench are illustrated in the Figures, it is to be appreciated that the invention can be used to form any number of trench and via structures in a dielectric layer(s) in addition to the single via and trench. It should also be noted that a via is used in the invention to describe a structure formed in a dielectric layer in which a contact is to be formed, and a trench is used to describe a structure formed in the dielectric layer in which a metal interconnect line is be formed.

Figure 1A:
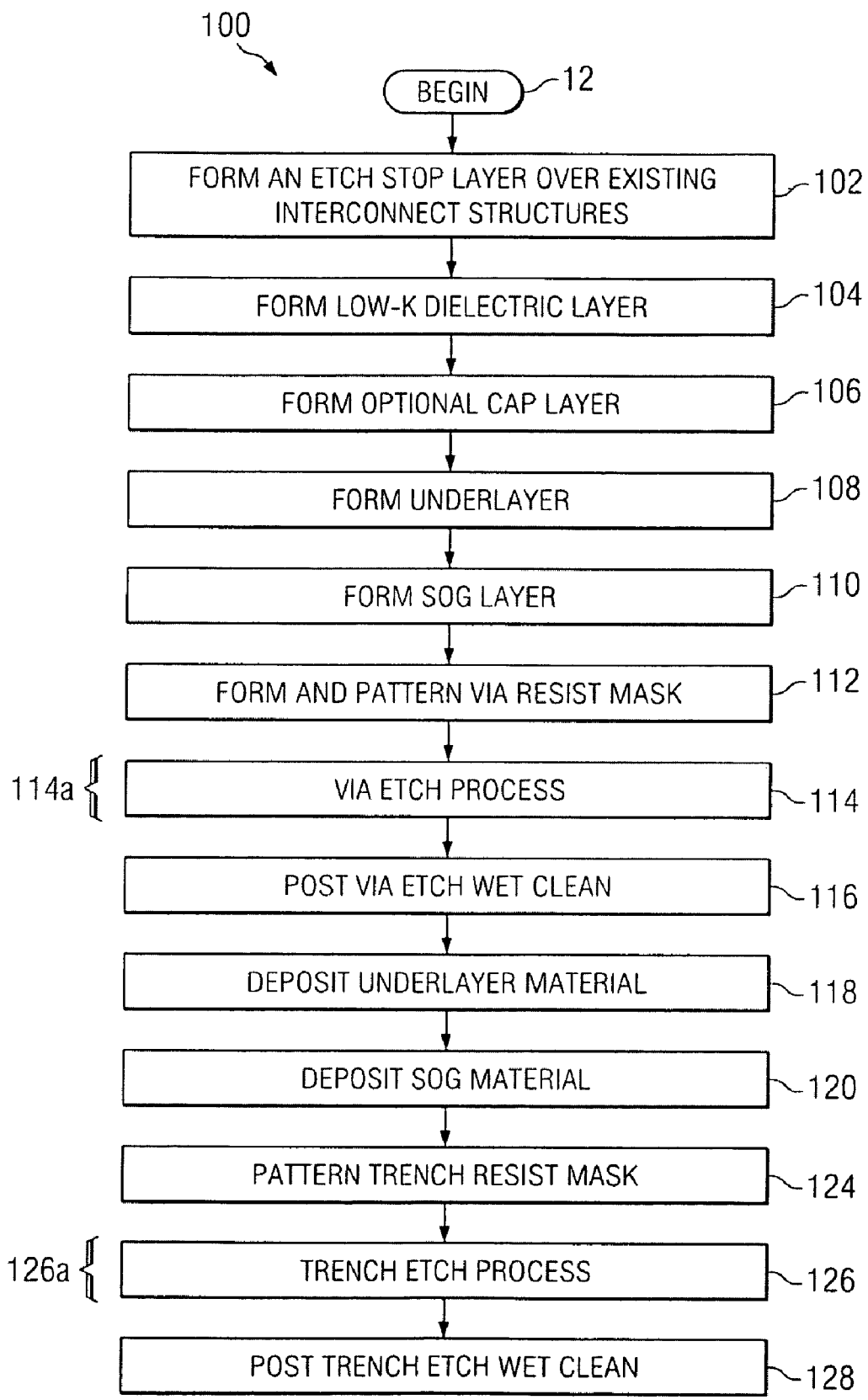
FIGS. 1A-1B are flow diagrams illustrating a method of fabricating single and/or dual damascene structures and removal of residue in a cavity therein in accordance with an embodiment of the invention.

An exemplary via-first implementation for removal of residue from a cavity during formation of a dual damascene interconnect structure overlying an existing interconnect structure in a semiconductor wafer is illustrated with reference to method 100 in FIGS. 1A and 1B. While the method 100 is illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the invention. Furthermore, the methods according to the invention may be implemented in association with the formation and/or processing of structures illustrated and described herein as well as in association with other structures not illustrated.

Beginning at 12, the method 100 comprises forming an etch-stop layer over an existing interconnect structure at 102, forming a low-k dielectric layer over the etch-stop material at 104, and optionally forming a cap layer at 106 over the dielectric layer. Any appropriate etch-stop and dielectric materials and layer fabrication techniques may be employed at 102 and 104, respectively, such as depositing SiN, SiC, SiCO or SiCN etch-stop material to a thickness of about 200 Å to about 1000 Å using any appropriate deposition technique such as chemical-vapor deposition (CVD) or the like. An underlayer is then formed at 108, followed by formation of SOG layer 110.

A via photoresist is then formed and patterned at 112, having an opening in a prospective via region of the wafer. A via etch is performed at 114, creating a via cavity or opening in the dielectric layer and optional cap layer. Via etch can comprise a multi-step process 114a. As illustrated with reference to FIG. 2A, following formation and patterning of photoresist, pattern is transferred to SOG layer 202 and then to underlayer 204. A main etch is performed at 206, followed by an overetch 208. Method then continues in FIG. 1A at 116, where a via etch wet clean is performed.

Figures 2A, 2B:
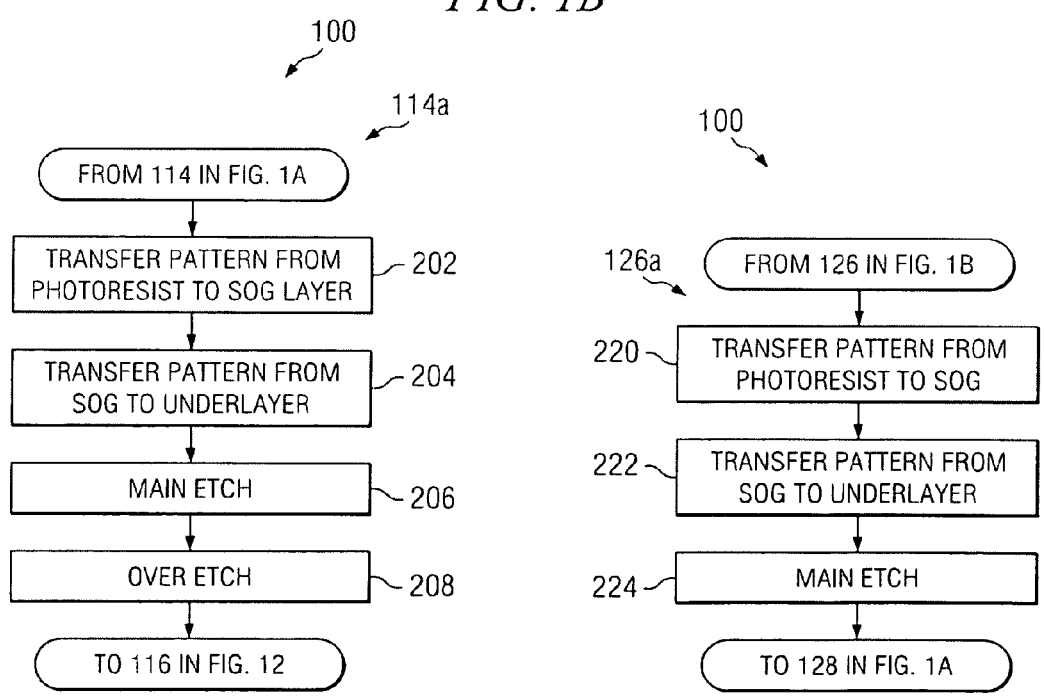
FIGS. 2A-2B are partial flow diagrams illustrating additional steps for forming single and/or dual damascene structures in the fabrication method of FIGS. 1A-1B.

A second layer of underlayer material is then formed 118, filling via. A second layer of SOG material is formed 120 over underlayer, followed by formation and patterning of a second photoresist at 124 in a proposed trench region. A trench etch is performed at 226, which can comprise a multi-step process 126a. As illustrated in FIG. 2B, following formation and patterning of photoresist, pattern is transferred to SOG layer 220 and then to underlayer 222. A trench etch is then performed 224, and method continues at 128 in FIG. 1A, where a trench etch wet clean is performed 128.

Figure 1B:
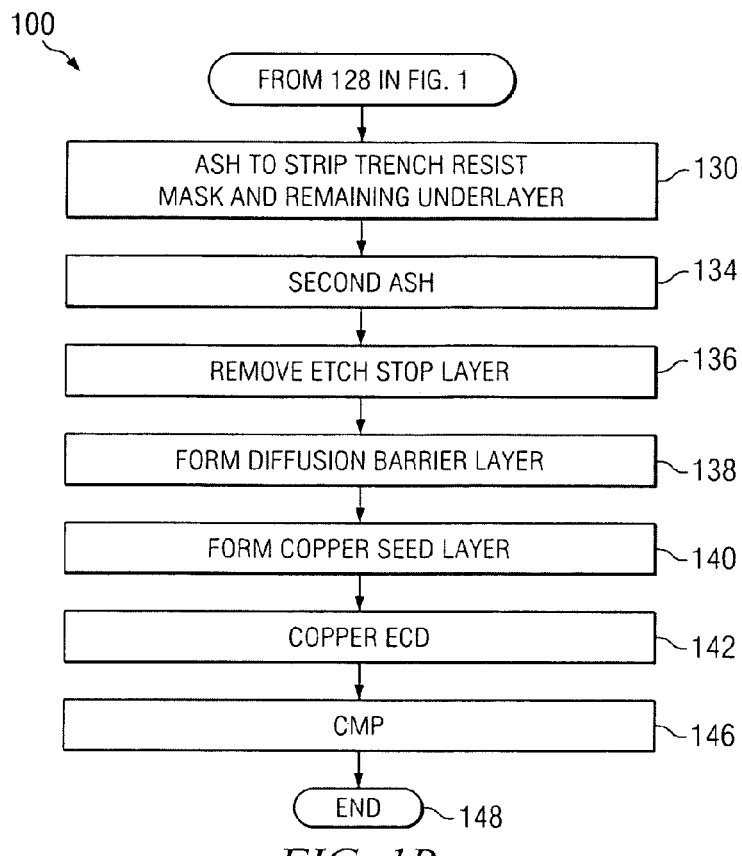

Referring to FIG. 1B, thereafter, at 130, a first ashing operation in accordance with the invention is performed to strip the trench resist mask and remaining underlayer. The first ash is followed by a second ashing operation, or overash at 134. An etch-stop layer etch 136 is then performed to remove the exposed portion of the etch-stop material, thereby extending the cavity and exposing a conductive feature in the underlying interconnect structure. A wet clean operation is then performed. A diffusion barrier is then formed at 138, and a seed copper layer is deposited over the diffusion barrier at 140, to facilitate subsequent copper filing of the via and trench cavities. The trench and via cavities are then filled with copper using an ECD process at 142, and a CMP process is performed at 146 to planarize the upper surface of the device, before the method ends at 148. It is noted that alternative implementations are possible with the scope of the invention, for example, wherein the trench is formed prior to formation of the cavity.

Figure 3A:
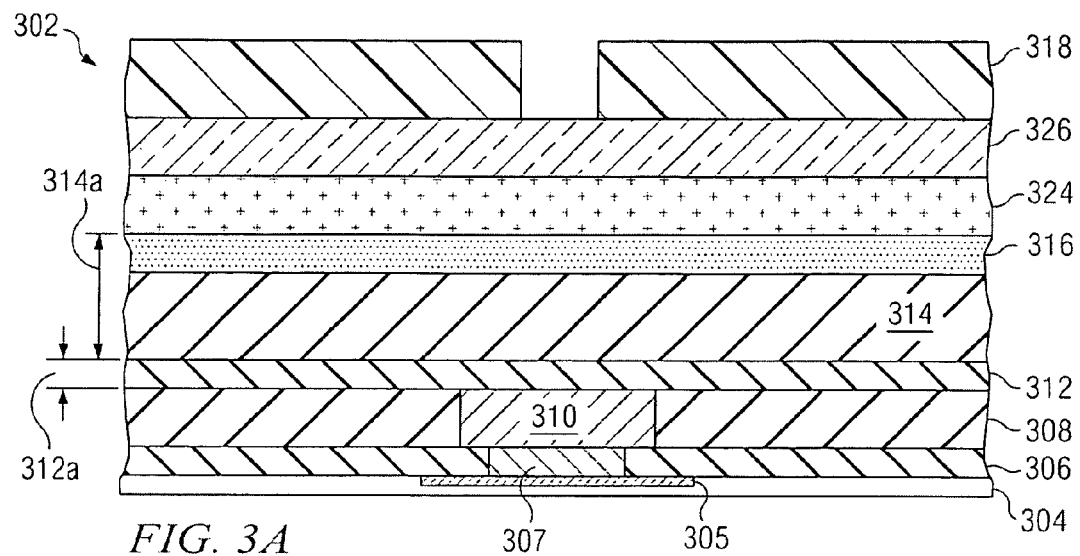

Application of the invention will now be described in conjunction with FIGS. 3A-3J, in which there is illustrated a method for forming a dual damascene interconnect structure overlying an existing interconnect structure in a semiconductor wafer, which may be employed in a via-first implementation or a trench-first dual damascene implementation to provide electrical coupling to a conductive feature in the existing interconnect structure. FIG. 3A illustrates a wafer 302 at an intermediate stage of fabrication, comprising a silicon substrate 304, in which a conductive silicide structure 305 is formed. An initial contact layer is formed over the substrate 304, comprising a dielectric 306 with a tungsten contact 307 extending therethrough, and electrically contacting the silicide 135. An existing interconnect structure overlies the contact layer, including an etch-stop layer (not shown) and a dielectric 308 in which a conductive feature 310 is formed, such as a copper trench metal, to provide electric coupling to the tungsten contact 307. The dual damascene processing of the invention may be carried out in fabricating an interconnet structure over an initial contact structure, such as illustrated in FIG. 3A, and/or in forming such a structure over another single or dual damascene structure in a multi-layer interconnect network structure.

A SiN, SiO, SiCO or SiCN etch stop layer 312 is formed 102 over the existing interconnect dielectric material 308 and over the conductive feature 310, for example, to a thickness 312' of about 200-1000 Å, and a dielectric layer 314, such as an ultra low-k dielectric material, is formed over the etch-stop layer 312 to a thickness 314' of about 2000-11000 Å. An optional cap layer 316 overlies the dielectric 314. The cap layer 316 can comprise an organic, such as a tetraethylorthosilicate (TEOS) layer. An underlayer material is formed over optional cap layer 316. A SOG layer 326 is then formed over the underlayer 324. An initial patterned resist 318 is formed over the SOG layer 316, having an opening 3in a prospective via region. The patterned resist 318 can be a single layer of resist or a tri-layer lithography process can be utilized.

Figure 3B:
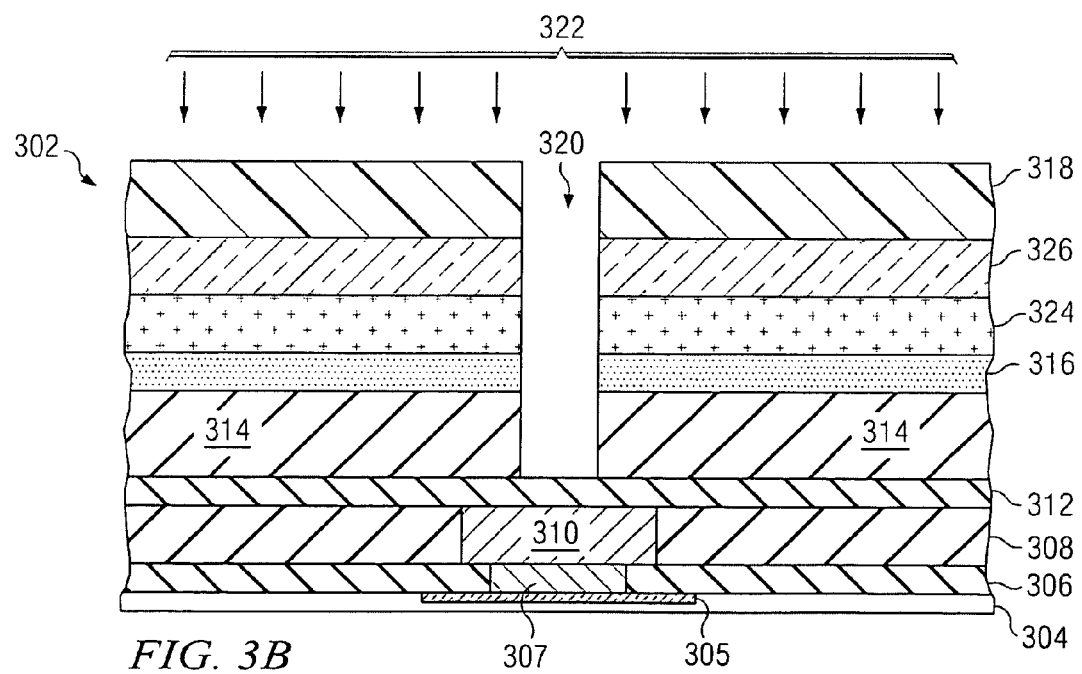

In FIG. 3B, mask 318 is patterned, followed by a via etch process 322 to form a via cavity 320 through layers 326, 324, 316, 314, stopping on and exposing a portion of the underlying etch-stop layer 312 in the via region 320. The etch process can be a single-step or a multi-step process performed in a plasma etch tool, such as one or more patterned etch processes to remove material from portions of the SOG layer 326, underlayer 324, optional cap layer 318 and dielectric layer 314. A post via etch cleaning operation 116, such as a wet clean, is then performed.

Figure 3C:
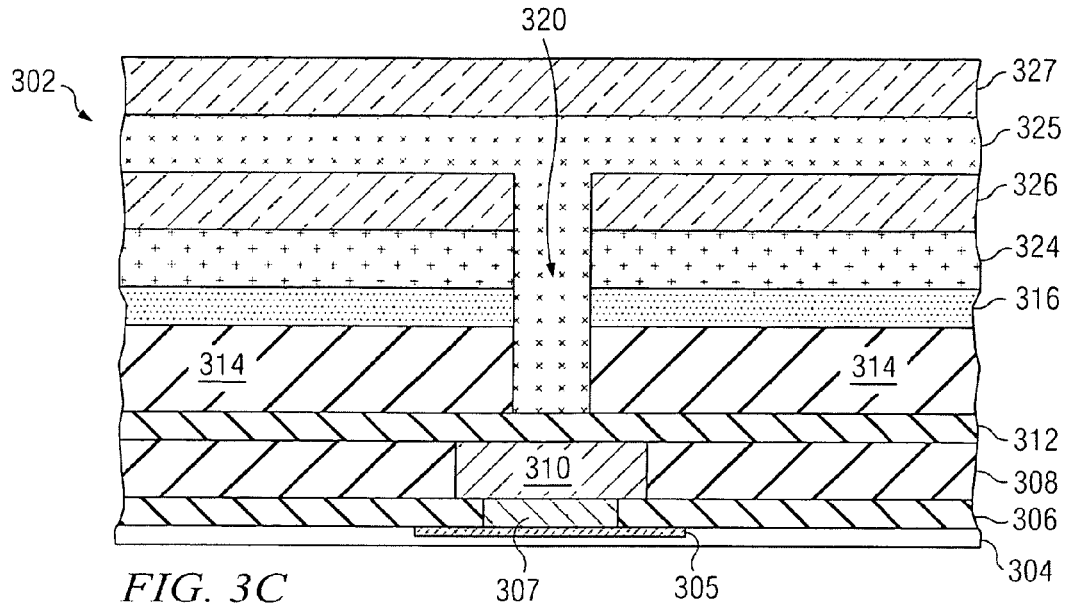
Figure 3D:
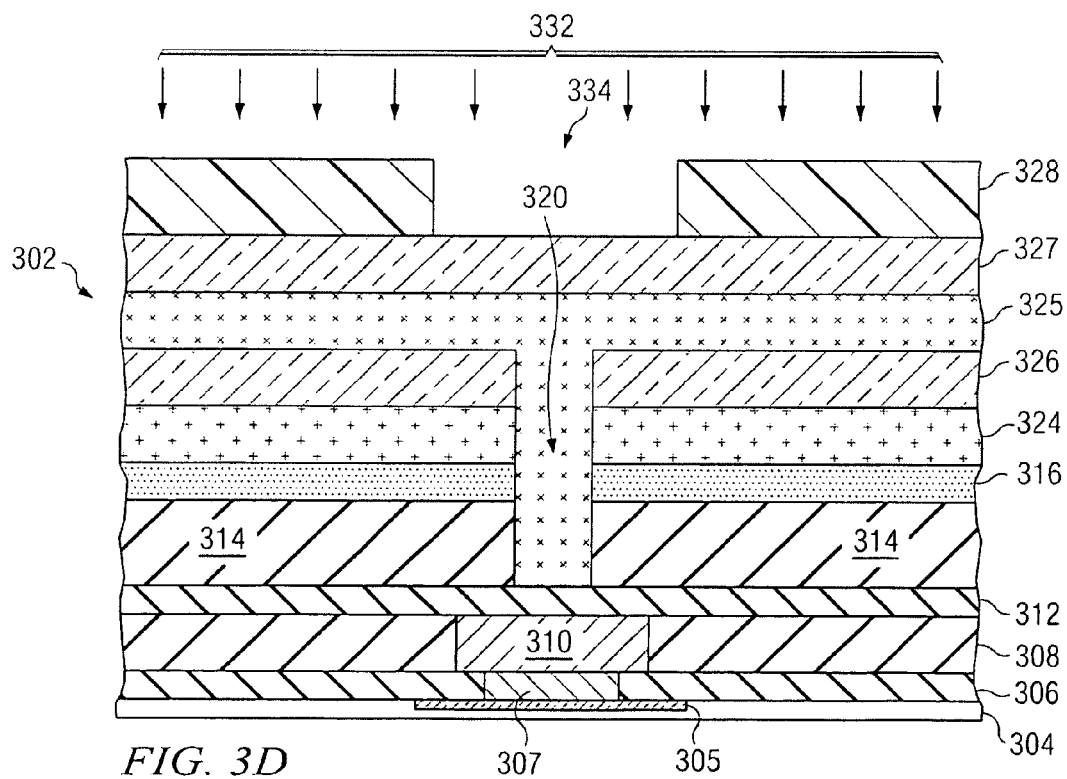

In FIG. 3C, a second underlayer material 325, for example, an organic film, is formed over the remaining cap layer 316 and filling the via region 320. A second SOG layer 327 is formed over the underlayer 325. In FIG. 3D, a second photo resist 328 is formed and patterned over the SOG layer 327, having an opening in a prospective trench region. A trench etch process 332 is used to form a trench cavity 334.

Figure 3E:
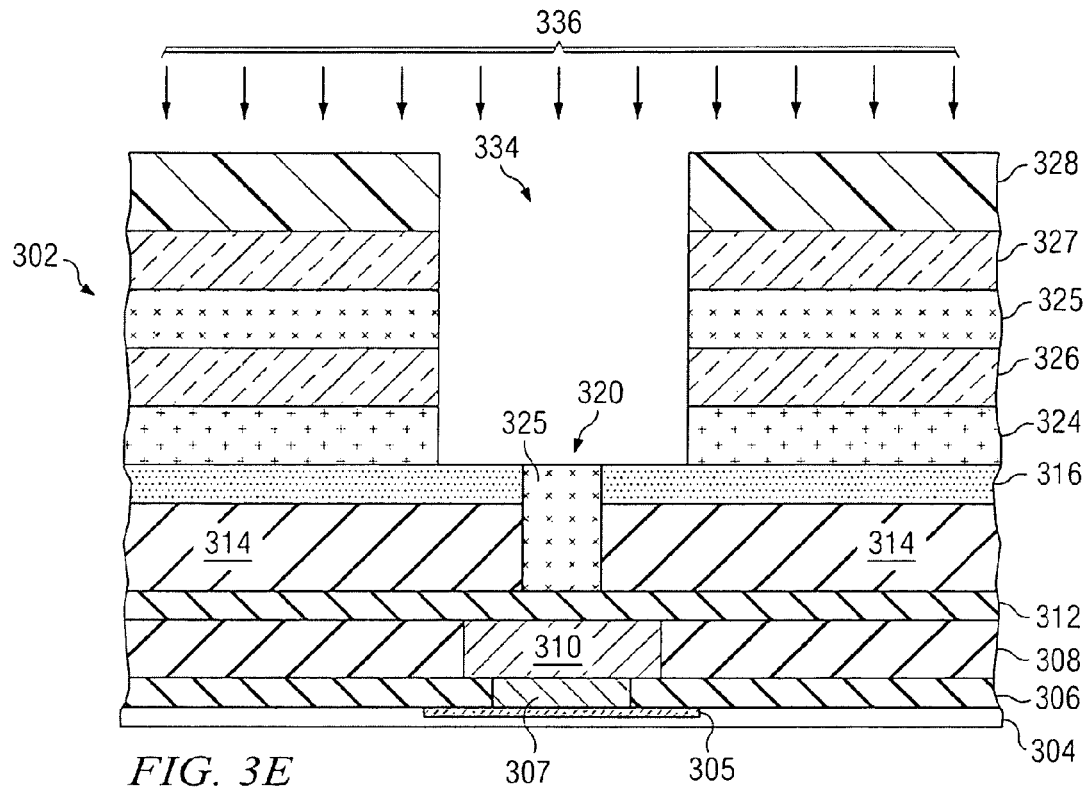
Figure 3F:
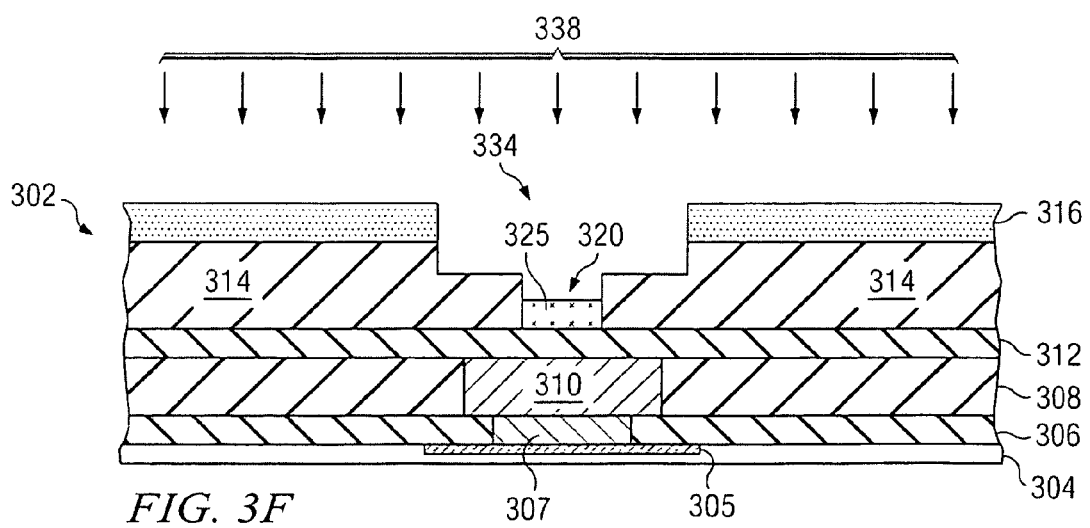

A further trench etch process 336 is performed in FIG. 3E to further form the trench 334 through layers 376, 325, 326, and underlayer 324, and stopping at the cap layer 316, followed by a main etch process 338 in FIG. 2F, in which to form trench cavity 334 into the dielectric layer 314 and removal of the SOG layer 327, 325 and underlayer 326, leaving a thickness of underlayer material 325 unetched at the bottom of the via cavity 320.

Figure 3G:
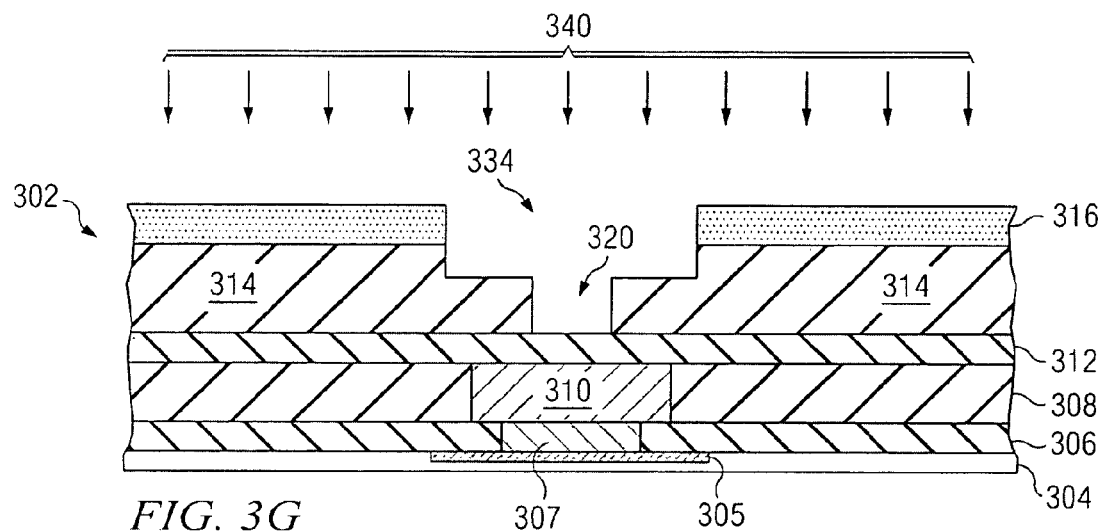

Thereafter, an ashing operation 340 in accordance with the invention and as described hereinafter is used to remove residual underlayer 325 and any polymer residue formed during previous etch steps, as shown in FIG. 3G.

Residue is removed using an ashing operation prior to etching of etch stop layer 312. In one embodiment, ashing operation is a two step process, including a first ash and a second overash. In another embodiment, ashing operation can be one continuous ash, such that the overash occurs as a continuation of the first ash. The process is performed as part of a trench etch on a plasma etch tool wherein the wafer 302 is exposed to a plasma comprising a process gas. The composition of the process gas can be varied and can be a carbon dioxide, carbon monoxide or oxygen process gas, or a mixture thereof. A process gas such as $H_2$ or $NH_3$ can also be used, either alone or in conjunction with other gases (e.g., inert noble gases such as He and Ar, and $N_2$).

The process parameters of the method of the invention can, for example, utilize a chamber pressure of 10 to 300 mTorr, a process gas flow rate of 10 sccm to 4000 sccm, a power ranging from about 200 watts to about 2000 watts, and a RF bias of 0 to 1000 volts. Although a specific temperature range is not required to practice the invention, the temperature of the process may be varied. Typically, the temperature will range between −20° C. and 90° C.

The end of the first ash operation 340 and the second ashing operation 342 can be determined using endpoint detection. One possible method of endpoint detection is to monitor a chemical component within the chamber. A chemical spectrum is collected. After emission levels corresponding to the chemical species cross a specified threshold (e.g., drop to substantially zero or increase above a particular level), the ash step is considered to be complete.

Another possible method of endpoint detection is to monitor a portion of the emitted light spectrum from the plasma region that indicates when all (or substantially all) of the polymer (and possibly the photoresist) has been removed from the chamber. For example, portions of the spectrum that indicate such a removal have wavelengths of 482.5 nm (CO), 775.5 nm (F), and 440 nm (SiF.sub.4), and can be measured using Optical Emission Spectroscopy (OES). After emission levels corresponding to those frequencies cross a specified threshold (e.g., drop to substantially zero or increase above a particular level), the first step is considered to be complete. Other wavelengths that provide endpoint information can also be used.

After the end of the first ash operation 340, a second ash operation preferably utilizes a 50-500% overash to remove any remaining post-ash residue (PAR). That is, if the first step is completed in 50 sec, the second step would be 25 sec for a 50% overash and 50 sec for a 100% overash. The process parameters of the second ash can be identical to the parameters of the first ash.

Figure 3H:
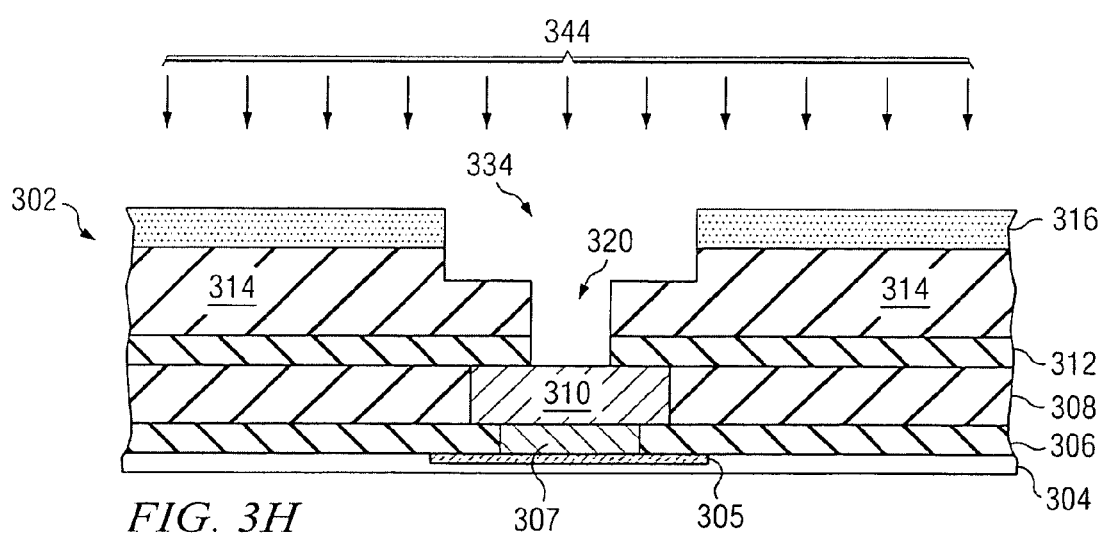

An etch-stop etch 344 is performed immediately thereafter in FIG. 3H to remove the exposed portion of the etch stop layer 312, thereby exposing the conductive feature 310. A post etch treatment (PET) can then be performed to remove any residue deposited on the via/trench sidewalls during removal of the etch stop layer, followed by a wet clean process.

Figure 3I:
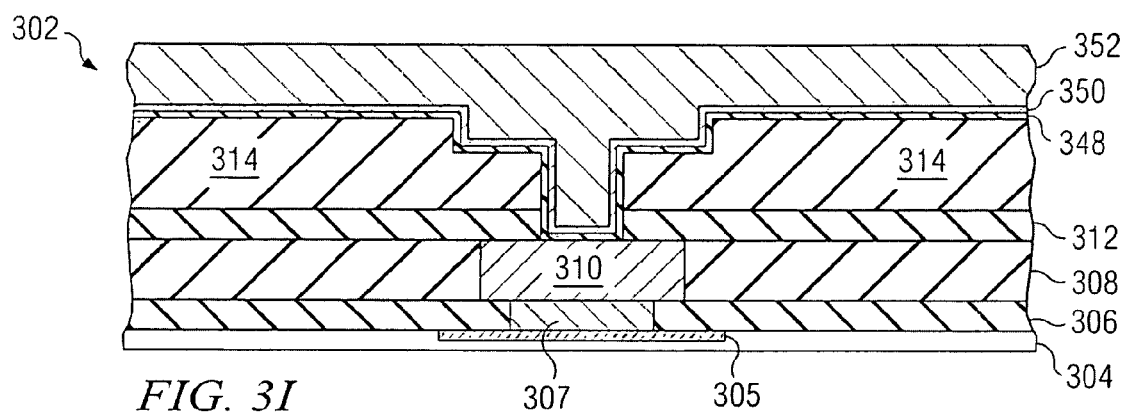
Figure 3J:
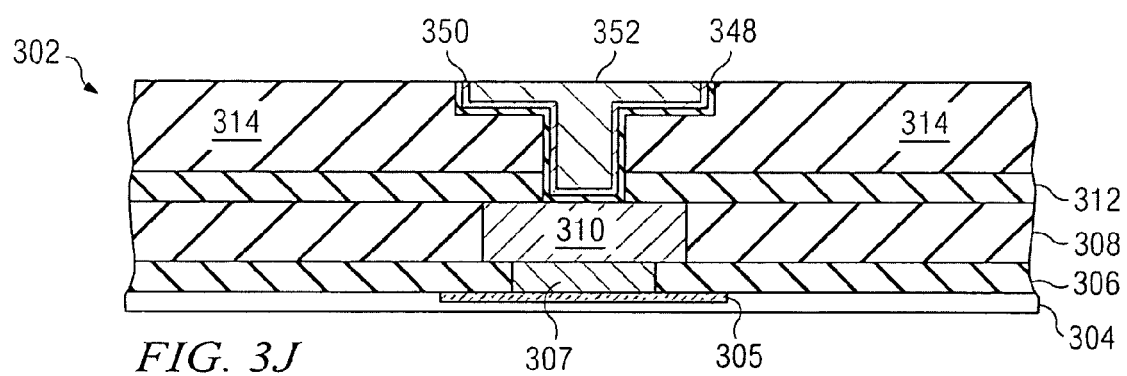

As illustrated in FIG. 3I, a diffusion barrier layer 348 and a copper seed layer 350 are formed, after which copper fill material 352 is deposited over the wafer 302 to fill the trench and via cavities 334 and 320, respectively, for example, using an ECD process. Thereafter, in FIG. 3J, the wafer 302 is planarized, for example, using a CMP process, to complete the conductive dual damascene trench and via structure. One or more subsequent interconnect levels or layers may thereafter be constructed over the structure of FIG. 3J, for example, using the above-described or other dual damascene fabrication techniques. Any number of such layers or levels may be fabricated in accordance with the invention, to provide electrical coupling to the conductive feature (e.g., silicide structure 306) in the wafer 302.

Referring also to FIGS. 4A-4B, illustrations are provided showing cross-sectional views of dual damascene structures structures. FIG. 4A illustrates dual damascene routing trenches undergoing conventional processing. FIG. 4B illustrates another wafer undergoing the dual damascene interconnect processing with the ashing operation according to the invention (e.g., method 100 above).

As can be seen from FIGS. 4A and 4B, the trench profiles of the image 352 formed in accordance with the method of the invention are significantly better than in the conventional case of the image 350. As illustrated in FIGS. 4A and 4B, the method of the invention removes residue from the wafer surface and within exposed features without damaging the dielectric material. The method, moreover, does not measurably impact the trench/via profiles or critical dimensions (CDs). Although the invention has been illustrated and described with respect to one or more implementations, equivalent alterations and modifications will occur to others skilled in the art upon the reading and understanding of this specification and annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of manufacturing an integrated circuit, comprising forming a dual damascene interconnect structure, including:
   forming an etch-stop layer over a conductive feature formed on a semiconductor substrate;
   forming a dielectric layer over the etch-stop layer; the dielectric layer comprising a first dielectric layer, a cap layer overlying the first dielectric layer, and an underlayer material layer overlying the cap layer;
   forming a first resist layer over the dielectric layer;
   patterning the first resist layer to define a via opening;
   forming a via cavity by a first etch of the dielectric layer though the via opening, down to the etch-stop layer;
   removing the patterned first resist layer, following the first etch;
   forming an organic film over the dielectric layer and within the via cavity;
   forming a second resist layer over the organic film;
   patterning the second resist layer to define a trench opening over the via cavity;
   forming a trench cavity by a second etch of the organic film and dielectric layer through the trench opening, down to the cap layer;
   removing the patterned second resist layer, following the second etch;
   following removal of the patterned second resist layer, performing a third etch to extend the trench cavity into the first dielectric layer, removing remaining portions of the underlayer material layer and leaving a remaining portion of the organic film at a bottom of the via cavity;
   performing an ash operation to remove the remaining portion of the organic film from the via cavity and to remove resist residues from the first and second etches; the ash operation including a first portion performed for a first time until monitoring of a chemical level or an emitted light wavelength indicates that substantially all of at least one of the organic film or resist residues has been removed, and a second portion performed after the first portion and for a second time equal to at least 50% of the first time;
   following the ash operation, extending the via cavity through the etch-stop layer by a fourth etch to expose the conductive feature; and
   following the fourth etch, forming a diffusion barrier layer within the via and trench cavities; forming a copper seed layer over the diffusion barrier within the via and trench cavities; and depositing copper fill material over the copper seed layer to fill the via and trench cavities.

2. The method of claim 1, wherein the endpoint is determined by monitoring a level of a chemical component to determine when the level of the component crosses a specified threshold.

3. The method of claim 2, wherein the endpoint is determined by monitoring an emitted light spectrum from a plasma, to determine when substantially all of at least one of the organic film or resist residues has been removed.

4. The method of claim 3, wherein monitoring the emitted light spectrum comprises monitoring at least one of a 482.5 nm, 775.5 nm or 440 nm. wavelength.

5. The method of claim 1, wherein the second time is 50-500% of the first time.

6. The method of claim 1, wherein the ash operation is performed at a chamber pressure of about 10-300 mTorr, a flow rate of process gas of about 10-4000 sccm, and a power of about 200-2000 watts.

7. The method of claim 1, wherein the ash operation is performed using a process gas comprising carbon dioxide, carbon monoxide, oxygen or a mixture thereof.

8. The method of claim 1, wherein the ash operation is performed using a process gas comprising $H_2$ or $NH_3$, either alone or in conjunction with other gases.

9. The method of claim 1, wherein the etch stop-layer comprises at least one of SiN, SiO, SiCO or SiCN.

10. The method of claim 1, wherein a wet clean is performed following the first etch.

11. The method of claim 1, wherein the detection comprises monitoring a level of a chemical component exhausted from a chamber, to determine when the level of the component crosses a specific threshold.

12. The method of claim 1, wherein the detection comprises monitoring at least one wavelength of an emitted light spectrum from a plasma.

13. The method of claim 12, wherein monitoring the at least one wavelength comprises monitoring at least one of a 482.5 nm, 775.5 nm or 440 nm. wavelength.

* * * * *